United States Patent
Gardner et al.

[11] Patent Number: 6,043,157
[45] Date of Patent: Mar. 28, 2000

[54] SEMICONDUCTOR DEVICE HAVING DUAL GATE ELECTRODE MATERIAL AND PROCESS OF FABRICATION THEREOF

[75] Inventors: Mark I Gardner, Cedar Creek; Mark C. Gilmer, Austin, both of Tex.

[73] Assignee: Advanced Micro Devices, Sunnyvale, Calif.

[21] Appl. No.: 08/993,286

[22] Filed: Dec. 18, 1997

[51] Int. Cl.[7] .................................................. H01L 21/00
[52] U.S. Cl. ......................... 438/692; 257/202; 257/262; 438/719; 438/735; 438/197
[58] Field of Search ...................... 438/692, 719, 438/742, 735, 753, 754, 197, 199; 257/202, 204, 249, 262, 270, 274, 288

[56] References Cited

U.S. PATENT DOCUMENTS 5,872,059   2/1999   Doan et al. ........................ 438/738 X

*Primary Examiner*—William Powell

[57] ABSTRACT

Generally, the present invention relates to a semiconductor device having a dual gate electrode material and a process of fabricating such a device. Consistent with one embodiment of the invention, a semiconductor device is formed by forming a first gate electrode over the substrate and forming a second gate electrode from a different material than the first gate electrode over the substrate. For example, the first gate electrode may be formed from polysilicon and a second gate electrode may be formed from a metal such as aluminum, titanium, cobalt, or copper. In accordance with one particular embodiment of the invention, the first and second gate electrodes are formed by forming a first layer of gate electrode material over the substrate, removing portions of the first gate electrode material to form the first gate electrode and a dummy gate electrode, forming a film over the substrate and between the first gate electrode and the dummy gate electrode, selectively removing the dummy gate electrode to form an opening while leaving the first gate electrode and the film substantially intact, and forming a second gate electrode in the opening.

22 Claims, 2 Drawing Sheets

SEMICONDUCTOR DEVICE HAVING DUAL GATE ELECTRODE MATERIAL AND PROCESS OF FABRICATION THEREOF

FIELD OF THE INVENTION

The present invention is directed generally to semiconductor devices, and more particularly a semiconductor device having a dual gate electrode material and a process of fabricating such a device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a gate electrode 103, which acts as a conductor, to which an input signal is typically applied via a gate terminal (not shown). Heavily doped source/drain regions 105 are formed in a semiconductor substrate 101 and are respectively connected to source and drain terminals (not shown). A channel region 107 is formed in the semiconductor substrate 101 beneath the gate electrode 103 and separates the source/drain regions 105. The channel is typically lightly doped with a dopant type opposite to that of the source/drain regions 105. The gate electrode 103 is physically separated from the semiconductor substrate 101 by a gate insulating layer 109, typically an oxide layer such as $SiO_2$. The insulating layer 109 is provided to prevent current from flowing between the gate electrode 103 and the source/drain regions 105 or channel region 109.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region/drain regions 105. In this manner an electric field controls the current flow through the channel region 107. This type of device is commonly referred to as a MOS field-effect-transistors (MOSFET).

Semiconductor devices, like the one described above, are used in large numbers to construct most modern electronic devices. One important step in the fabrication of a MOS device is the formation of the gate electrodes. A typical MOS device includes a large number of gate electrodes. Conventional fabrication techniques provide a common gate electrode layer which is used to form the gate electrodes of the device. Typically, gate electrodes are formed by depositing a layer of polysilicon over a gate insulating layer, such as a silicon dioxide layer, patterning the polysilicon layer, and etching portions of the polysilicon layer to form a plurality of gate electrodes over the substrate. The above described conventional techniques for forming gate electrodes impose limitations on the fabrication of devices. In particular, the use of a common gate electrode layer to form each gate electrode can impose limitations on processing and inhibit optimization of transistor performance.

SUMMARY OF THE INVENTION

Generally, the present invention relates to a semiconductor device having a dual gate electrode material and a process of fabricating such a device. Consistent with one embodiment of the invention, a semiconductor device is formed by forming a first gate electrode over the substrate and forming a second gate electrode from a different material than the first gate electrode over the substrate. For example, the first gate electrode may be formed from polysilicon and a second gate electrode may be formed from a metal such as aluminum, titanium, cobalt, or copper. In accordance with one particular embodiment of the invention, the first and second gate electrodes are formed by forming a first layer of gate electrode material over the substrate, removing portions of the first gate electrode material to form the first gate electrode and a dummy gate electrode, forming a film over the substrate and between the first gate electrode and the dummy gate electrode, selectively removing the dummy gate electrode to form an opening while leaving the first gate electrode and the film substantially intact, and forming a second gate electrode in the opening.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
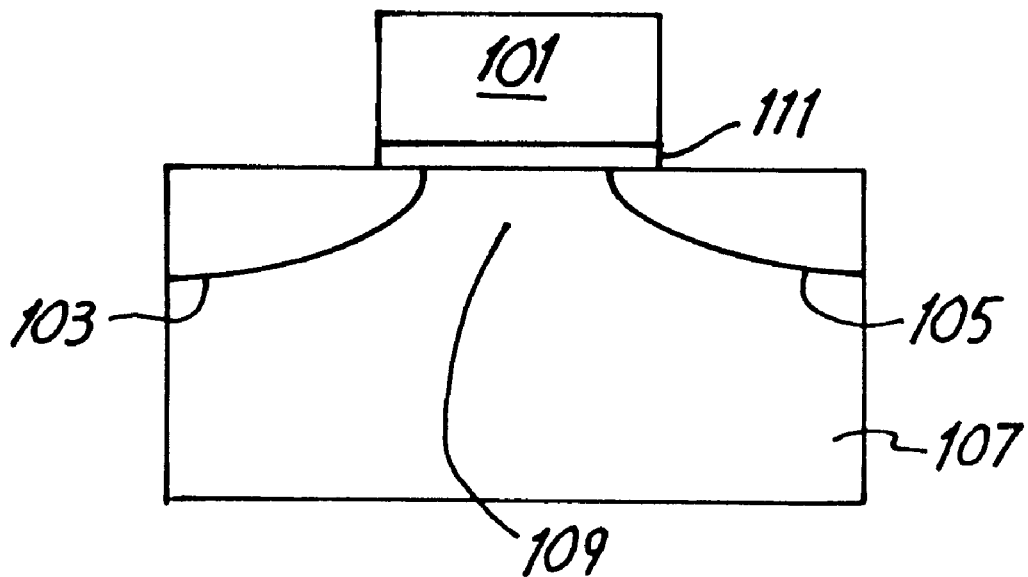
FIG. 1 illustrates components of a conventional MOS device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices (e.g., MOS, CMOS, BiCMOS transistors) which have gate electrodes. While the present invention is not so limited, an appreciation of various aspects of the invention is best gained through a discussion of various application examples of processes used to form such semiconductor devices.

FIGS. 2A–2G illustrate one example process for fabricating a semiconductor device having gate electrodes formed from different materials. In accordance with this process, a gate insulating layer 203 is formed over a substrate 201. The substrate 201 is typically formed from silicon. The gate insulating layer 203 may be formed from a number of different materials including, for example, an oxide. An oxide gate insulating layer 203 may be formed using, for example, well-known deposition or growth techniques. Suitable thicknesses for an oxide gate insulating layer 203 range from about 5 to 50 angstroms for many applications. Thin oxides (e.g., 5–10 angstroms) may be formed by annealing the substrate 201 in a nitrogen bearing ambient or by implanting nitrogen and annealing the substrate 201 in an oxygen and/or nitrogen bearing ambient.

Figure 2A:
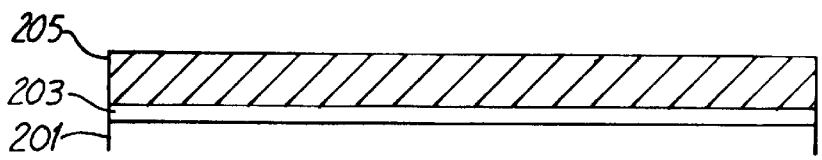
FIGS. 2A–2F illustrate a fabrication process in accordance with an embodiment of the invention.

A layer of first gate electrode material 205 is formed over the gate insulating layer 203. The resultant structure is illustrated in FIG. 2A. The gate electrode layer 205 will be used to form one or more gate electrodes over the substrate 201. The thickness of the gate electrode layer 205 is suitable selected in consideration of the desired thickness of the gate electrodes formed with this layer. Suitable thicknesses range from about 1000–3000 angstroms for many applications. The gate electrode material 205 may be formed from a number of different materials including, for example, polysilicon. A polysilicon gate electrode layer 205 may be formed using, for example, well-known deposition techniques.

Figure 2B:
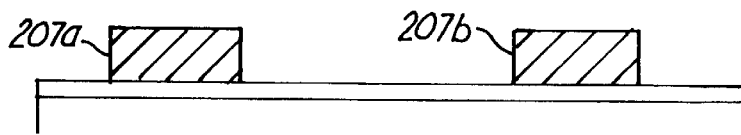
Figure 2C:
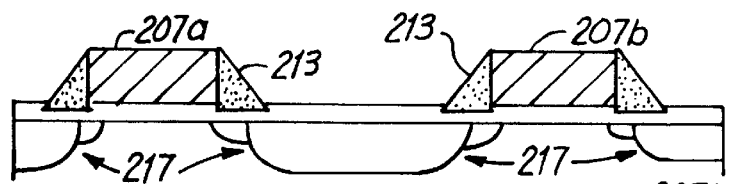

Portions of the gate electrode layer 205 are removed to form a plurality of gate electrodes (only two of which are shown) over the substrate 201. This removal step may be performed using, for example, well-known photolithography and etching techniques. The resultant structure is illustrated in FIG. 2B. The gate electrode 207a will be used as the gate electrode for a transistor, while the other gate electrode 207b is a dummy gate electrode which is used to define a region in which a gate electrode will later be formed.

Source/drain regions 217 are formed in portions of the substrate 201 adjacent the gate electrode 207a and dummy gate electrode 207b. The illustrated source/drain regions 217 are lightly-doped drain (LDD) source/drain regions, however, the invention is not so limited. LDD source/drain regions 217 may be formed by implanting a low dose of a dopant into the substrate 201 to form a lightly doped region, forming spacers 213 on sidewalls of the gate electrode 207a and dummy gate electrode 207b, and implanting a heavier dose of the same or a similar type dopant into substrate 201 to form heavily doped regions. Formation of LDD source/drain regions 217 may be done using, for example, well-known techniques. While the central source/drain region 217 in the illustrated embodiment is common to both the gate electrode 207a and dummy gate electrode 207b, it should be appreciated that the invention is not so limited. For example, an isolation region may be formed between the gate electrode 207a and dummy gate electrode 207B to isolate to their respective active devices. For example, where gate electrode 207a is used in an NMOS transistor and dummy gate electrode 207b is used to form a gate electrode for a PMO transistor an isolation region will typically be formed between the two gate electrodes 207a and 207b. It should be appreciated that where a CMOS is formed, the source/drain regions are formed using suitable masking techniques (e.g., PMOS, regions are typically masked during the implanting of NMOS regions and vice versa).

Figure 2D:
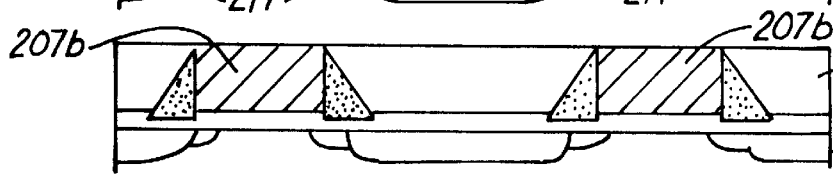

After forming the source/drain regions 217, a film 215 is formed over the substrate 201, as illustrated in FIG. 2D. The film 215 is formed from a material which may be left intact while the dummy gate electrode 207B is selectively removed. Where the dummy gate electrode 207B is formed from silicon, an oxide such as $SiO_2$ would be a suitable material for the film 215. The film 215 may be formed, for example, by depositing a layer of the film 215 of the substrate and planarizing the film 215 with the upper surfaces of the gate electrode 207a and dummy gate electrode 207b. This may be done using, for example, well-known deposition and chemical-mechanical polishing techniques. The resultant structure is illustrated in FIG. 2D.

Figure 2E:
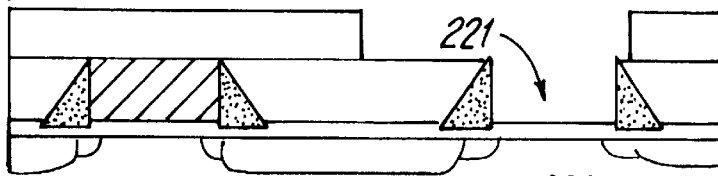

A mask 219 is formed over the substrate 201 and patterned to expose the dummy gate electrode 207b. This may be done using, for example, well-known photolithography and etching techniques. The mask 219 may, for example, be formed from a photoresist. With the mask 219 in place, the dummy gate electrode 207b is selectively removed to leave an opening 221 between the spacers 213 formed adjacent the dummy gate electrode 207b as discussed above. The resultant structure is illustrated in FIG. 2E. The dummy gate electrode 207b may be removed using, for example, well-known etching techniques, such as plasma etching.

Figure 2F:
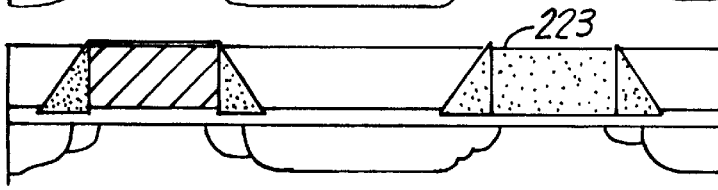

A second gate electrode material 223 different from the first gate electrode material 205 is formed in the opening 221, as illustrated in FIG. 2F. The gate electrode material 223 in the opening 221 will operate as a gate electrode for a transistor. The gate electrode material 223 may be formed in the opening 221 by, for example, depositing a layer of the gate electrode material 223 over the substrate 201 and planarizing the gate electrode material 223 with the upper surface of the film 215. This may be done using, for example, well-known deposition and chemical-mechanical polishing techniques. Suitable gate electrode materials 223 include metals such as copper, titanium, aluminum and cobalt, for example.

In an alternate embodiment, after forming the opening 221, portions of the gate insulating layer 203 in the opening 221 may be removed and a second gate insulating material may be formed in the opening 221 and used as the gate insulating layer for the gate electrode 223. For example, a layer of high permittivity material (i.e., having a dielectric constant greater than that of silicon dioxide), such as barium strontium titanate or titanium oxide, may be deposited over the substrate 201 after removing the mask 219 and overpolished to leave high permittivity gate insulating layer recessed within the opening 221. The gate electrode material 223 may then be deposited over the substrate 201 and polished with the upper surface of the film 215 to form the gate electrode material 223 over the high permittivity gate insulating layer. It should be appreciated that the polishing techniques used to over polish the high permittivity are typically selective to the first gate electrode material in this case.

Using the above processes, a semiconductor device having gate electrodes of different materials may be formed. For example, one or more gate electrodes may be formed from polysilicon while one or more gate electrodes may be formed from a metal. This allows, for example, the gate electrode material of the transistor to be selected to optimize the performance of the transistor. The above technique can, for example, also allow the use of temperature sensitive materials such as many metals to be used as gate electrodes since such metal gate electrode may be formed after the formation and anneal of source/drain regions. The use of a metal as a gate electrode can further enhance device performance by, for example, increasing the speed of the device.

The present invention is applicable to fabrication of a number of different devices where dual gate electrode materials and/or the associated advantages obtained there from are desired. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A process of forming a semiconductor device, comprising:

forming a first gate electrode and a second gate electrode over a substrate;

selectively removing the second gate electrode; and re-forming the second gate electrode from a different material than the first gate electrode over the substrate.

2. The process of claim 1, further including forming source/drain regions adjacent each of the first and second gate electrodes.

3. The process of claim 1, wherein the first gate electrode is formed from polysilicon and the re-formed second gate electrode is formed from a metal.

4. The process of claim 1, wherein re-forming the second gate electrode from a different material than the first gate electrode includes re-forming the second gate electrode from copper.

5. The process of claim 1, wherein the re-forming the second gate electrode includes re-forming the second gate electrode after formation of source/drain regions.

6. A process of forming a semiconductor device, comprising:

forming a first layer of gate electrode material over the substrate;

removing portions of the first gate electrode material to form a first gate electrode and a dummy gate electrode;

forming a film between the first gate electrode and the dummy gate electrode;

selectively removing the dummy gate electrode to form an opening while leaving the first gate electrode and the film substantially intact; and forming a second gate electrode in the opening.

7. The process of claim 6, wherein selectively removing the dummy gate electrode includes:

forming a mask over the substrate to cover the first gate electrode and expose the dummy gate electrode; and etching the dummy gate electrode.

8. The process of claim 6, further including forming a gate insulating layer before forming the first layer of gate electrode material.

9. The process of claim 8, further including using the gate insulating layer to insulate the first and second gate electrodes from the substrate.

10. The process of claim 8, further including removing a portion of the gate insulating layer in the opening and forming a second gate insulating layer in the opening.

11. The process of claim 10, further including using the first gate insulating layer to insulate the first gate electrode from the substrate and using the second gate insulating layer to insulate the second gate electrode from the substrate.

12. A process of fabricating a semiconductor device, comprising:

forming a gate insulating layer over a substrate;

forming a polysilicon layer over the gate insulating layer;

removing portions of the polysilicon layer to form a polysilicon gate electrode and a dummy gate electrode over the substrate;

implanting dopants into the substrate to form source/drain regions adjacent the polysilicon and dummy gate electrodes;

forming a film between the gate electrodes;

selectively removing the dummy gate electrode to form an opening while leaving the polysilicon gate electrode intact; and forming a metal gate electrode in the opening.

13. The process of claim 12, wherein implanting the dopants includes forming spacers on sidewalls of the polysilicon and dummy gate electrodes.

14. The process of claim 13, wherein the opening is formed between spacers associated with the dummy gate electrode.

15. The process of claim 12, further including using the gate insulating layer to insulate the metal gate electrode and the polysilicon gate electrode from the substrate.

16. The process of claim 12, further including removing a portion of the gate insulating layer in the opening and forming a second gate insulating layer in the opening.

17. The process of claim 16, further including using the first gate insulating layer to insulate the polysilicon gate electrode from the substrate and using the second gate insulating layer to insulate the metal gate electrode from the substrate.

18. The process of claim 17, wherein the second gate insulating material is formed from a high permittivity material.

19. A semiconductor device, comprising:

a substrate;

a first gate electrode disposed over the substrate; and a second gate electrode disposed over the substrate, wherein the first and second gate electrodes are formed from a different material, and wherein the second gate electrode is formed by first forming a dummy gate electrode, selectively removing the dummy gate electrode, and then forming the second gate electrode.

20. The device of claim 19, wherein the fist gate electrode is formed from polysilicon and the second gate electrode is formed from metal.

21. The device of claim 19, further including a first gate insulating layer between the first gate electrode and the substrate and a second gate insulating layer between the second gate electrode and the substrate, wherein the first gate insulating layer and second gate insulating layer are formed from a different dielectric material.

22. The device of claim 21, where the first gate insulating layer is an oxide and the second gate insulating layer is a high permittivity dielectric.

* * * * *